US 8,738,875 B2

(12) United States Patent
Carter et al.

(10) Patent No.: US 8,738,875 B2
(45) Date of Patent: *May 27, 2014

(54) INCREASING MEMORY CAPACITY IN POWER-CONSTRAINED SYSTEMS

(75) Inventors: John Bruce Carter, Austin, TX (US); Wei Huang, Austin, TX (US); Karthick Rajamani, Austin, TX (US); Freeman Leigh Rawson, III, Austin, TX (US); Joanne R. Rawson, legal representative, Austin, TX (US); Kshitij Sudan, Salt Lake City, UT (US)

(73) Assignee: International Business Machines Corporation, Armonk, NY (US)

( * ) Notice: Subject to any disclaimer, the term of this patent is extended or adjusted under 35 U.S.C. 154(b) by 280 days.

This patent is subject to a terminal disclaimer.

(21) Appl. No.: 13/295,196

(22) Filed: Nov. 14, 2011

(65) Prior Publication Data

US 2013/0124814 A1    May 16, 2013

(51) Int. Cl.
*G06F 12/06* (2006.01)

(52) U.S. Cl.
USPC ............................................ 711/163; 711/165

(58) Field of Classification Search
USPC .................................. 711/163, 165, 169, 170
See application file for complete search history.

(56) References Cited

U.S. PATENT DOCUMENTS

| | | | |
|---|---|---|---|
| 6,249,837 B1 | 6/2001 | Tsuchiya et al. | |
| 7,003,640 B2 | 2/2006 | Mayo et al. | |
| 7,580,309 B2 | 8/2009 | Yang et al. | |
| 7,631,228 B2 | 12/2009 | Brittain et al. | |
| 7,721,052 B2 | 5/2010 | Ogasawara et al. | |
| 7,793,129 B2 | 9/2010 | Ogasawara et al. | |
| 8,010,764 B2 | 8/2011 | Keller, Jr. et al. | |
| 2007/0011421 A1 | 1/2007 | Keller et al. | |
| 2008/0320203 A1 | 12/2008 | Fitzgerald | |
| 2009/0019243 A1 | 1/2009 | Hur et al. | |
| 2009/0248994 A1 | 10/2009 | Zheng et al. | |
| 2010/0169700 A1 | 7/2010 | Abraham et al. | |
| 2010/0332775 A1 | 12/2010 | Kapil et al. | |
| 2011/0093726 A1 | 4/2011 | Worthington et al. | |

FOREIGN PATENT DOCUMENTS

WO        2005069148 A       7/2005

OTHER PUBLICATIONS

Fang et al.; "Heterogeneous Mini-Rank: Adaptive, Power-Efficient Memory Architecture", 39th International Conference on Parallel Processing, 2010 IEEE, 21-29. 2010.
Zheng et al.; "Mini-Rank: Adaptive DRAM Architecture for Improving Memory Power Efficiency", 2008 IEEE, 210-221.

*Primary Examiner* — John Lane
(74) *Attorney, Agent, or Firm* — Garg Law Firm, PLLC; Rakesh Garg; John Flynn

(57) ABSTRACT

A system, and computer program product for increasing a capacity of a memory are provided in the illustrative embodiments. Using an application executing using a processor wherein the memory includes a set of ranks, the memory is configured to form a cold tier and a hot tier, the cold tier including a first subset of ranks from the set of ranks in the memory, and the hot tier including a second subset of ranks from the set of ranks in the memory. A determination is made whether a page to which a memory access request is directed is located in the cold tier in the memory. In response to the page being located in the cold tier of the memory, the processing of the memory access request is throttled by processing the memory access request with a delay.

7 Claims, 6 Drawing Sheets

INCREASING MEMORY CAPACITY IN POWER-CONSTRAINED SYSTEMS

TECHNICAL FIELD

The present invention relates generally to a system, and computer program product for improving the use of computing resources. Particularly, the present invention relates to a system, and computer program product for increasing the memory capacity in a power-constrained system.

BACKGROUND

Description of the Related Art

A data processing system uses memory for storing data used by an application. Storing data in memory and reading data from memory consumes electrical power (power).

A data processing system has a limited amount of power available for distribution amongst the various data processing system components, including memory. Increasing the memory size increases the power demand of the memory component.

An application's performance is dependent upon an amount of memory available in the data processing system and a speed at which the memory responds to the application's memory access request. Reading and writing to main memory is generally performed using cachelines. A cacheline of memory is a defined size of data that can be read from or written into the main memory to/from higher level caches. A page is a unit of memory size at which granularity the operating systems manage memory allocation, access and transfer of data from primary storage (main memory) to secondary storage (e.g. disks). Under certain circumstances, a page of memory can be removed (paged-out) from the memory to a secondary storage, such as a hard disk drive. When an application accesses any cacheline in a paged-out page, the page has to be brought in (paged-in) to the main memory before the cacheline request can be serviced.

Page-out and page-in operations have an adverse effect on an application's performance. An amount of paging in and out of pages from a memory is a factor of the workload on the data processing system and the size of the memory in the data processing system.

SUMMARY

The illustrative embodiments provide a system, and computer program product for increasing memory capacity in a power-constrained system. An embodiment configures, using an application executing using a processor wherein the memory includes a set of ranks, the memory to form a cold tier and a hot tier, the cold tier including a first subset of ranks from the set of ranks in the memory, and the hot tier including a second subset of ranks from the set of ranks in the memory. The embodiment determines whether a page to which a memory access request is directed is located in the cold tier in the memory. The embodiment throttles, responsive to the page being located in the cold tier of the memory, the processing of the memory access request by processing the memory access request with a delay.

BRIEF DESCRIPTION OF THE SEVERAL VIEWS OF THE DRAWINGS

The novel features believed characteristic of the embodiments are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION

Figure 1:
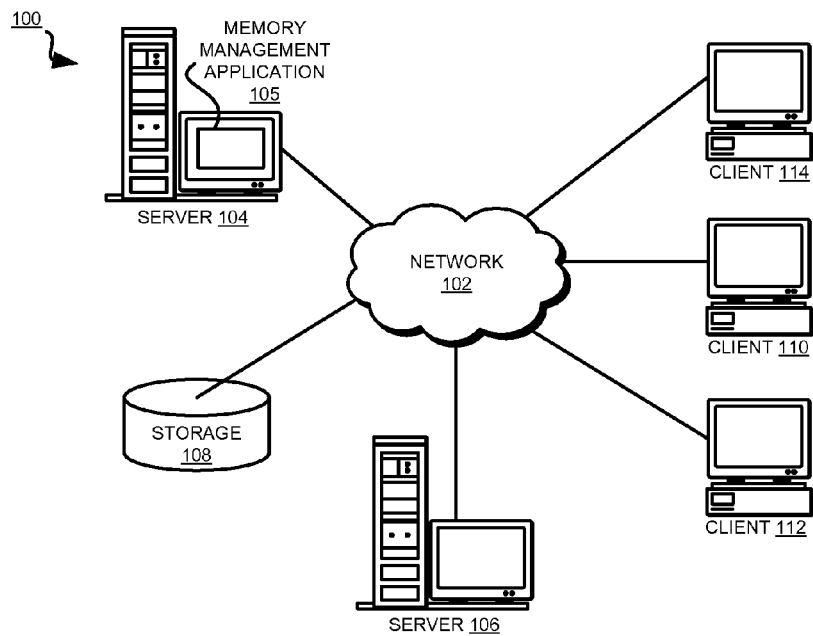
FIG. 1 depicts a pictorial representation of a network of data processing systems in which illustrative embodiments may be implemented.

The illustrative embodiments recognize that the amount of power that a memory in a data processing system can use is a factor in determining the memory capacity available in the data processing system, and a performance of the data processing system. The amount of power that a memory in a data processing system can use is called a memory's power budget.

A memory's power budget can be the maximum power the memory component of the data processing system can use because of the data processing system's power supply configuration. A memory's power budget can also be set below that maximum by an application or a user. Regardless of how set, a memory has to operate within the memory's power budget, and deliver a desired level of operational performance while operating within that budget.

A memory unit, such as a Dual In-line Memory Module (DIMM), is organized into ranks. A memory unit typically includes many memory devices that operate in conjunction as a memory. A memory rank (rank) is a subset of devices that respond together to a memory access request for a cacheline. A memory page is typically contained in one or more memory ranks. References to a page within a rank are used instead of a page within a set of ranks without loss of generality and without implying a limitation on the embodiments. Further, while the embodiments are described with respect to main memory devices physically organized in the form of ranks, the embodiments are similarly applicable to other memory devices organized in different forms.

Presently, a rank can operate in various power consumption modes, including an active mode and a low-power mode. When in the active mode, a rank is ready and available for access to the pages stored in the rank. Consequently, a rank in active mode consumes a significant amount of power. In a low-power mode, the rank maintains the data stored therein, such as by a self refresh operation, but is not ready to service a memory access request. Consequently, a rank in low-power mode consumes significantly less power as compared to a rank in active mode, but has to be made active, such as by a memory manager, before a page in that rank can be accessed to process a memory access request.

The illustrative embodiments recognize that placing a rank in low-power mode and making the rank active from the low-power mode are time consuming processes. Consequently, an application attempting to access a page in the rank in low-power mode incurs a performance degradation due to the latency of the rank's entry into and exit from the low-power mode.

The illustrative embodiments further recognize that placing a rank in low-power mode and making the rank active from the low-power mode are also power consuming processes. Consequently, a memory where ranks are frequently switched from active to low-power and low-power to active modes also incurs an increased power consumption cost.

One presently used method for operating a memory within a power budget is to use only that number of ranks that can be active within the power budget. The illustrative embodiments recognize that generally, the number of operating ranks tends to be smaller than an available umber of ranks in a given memory configuration. Reducing the number of active ranks can increase the paging-out and paging-in activity in the memory, degrading workload performance.

One presently used method for limiting the number of active ranks switches some memory ranks from active mode to low-power mode to conserve power. The illustrative embodiments recognize that application attempting to access a page in a rank in low-power mode incurs a performance degradation due to the latency of the rank's entry into and exit from the low-power mode.

Presently available memory power and performance management methods accept the performance degradation resulting from the switching some ranks to a low-power mode because the performance degradation from the mode switching is preferable to the performance degradation from paging memory pages to disk.

The illustrative embodiments used to describe the invention generally address and solve the above-described problems and other problems related to limiting memory capacity due to power and performance demands in a data processing system. The illustrative embodiments provide a system, and computer program product for increasing memory capacity in a power-constrained system. A power-constrained system constrains the power consumption of a component, such as memory, to a certain limit. A memory is power-constrained if the power consumption of the memory is limited to a power budget.

Generally, the illustrative embodiments provide a tiered method of organizing the ranks of a given memory such that all the tiers together, and the ranks within those tiers operate within a given power budget. A hot tier is a category of ranks in which the ranks are operating in an active mode. A cold tier is a category of ranks in which the ranks are in operating a low-power mode.

An embodiment increases a total number of ranks that can process memory access requests from the hot and cold tiers, thereby increasing the memory capacity in the data processing system. An embodiment further provides a way of using a rank in a cold tier such that the advantages of keeping the rank in the cold tier are maximized while processing requests for accessing a page in the rank.

An embodiment further provides a manner of processing memory access requests generally, including requests directed to hot tier ranks, such that the total power consumption of the ranks in the hot and cold tiers remains within the power budget while delivering at least a threshold level of workload performance. Thus, an embodiment provides increased memory capacity in a data processing system where the memory is power-constrained.

The illustrative embodiments are described with respect to certain computing resources only as examples. Such descriptions are not intended to be limiting on the illustrative embodiments. For example, an illustrative embodiment described with respect to a particular type of memory can be implemented with respect to another type of memory within the scope of the illustrative embodiments.

Similarly, the illustrative embodiments are described with respect to certain workload analysis and performance factors only as examples. Such descriptions are not intended to be limiting on the illustrative embodiments. For example, an illustrative embodiment described with respect to an access rate of a page can be implemented using access rate for a set of pages within the scope of the illustrative embodiments.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention.

The illustrative embodiments are further described with respect to certain applications only as examples. Such descriptions are not intended to be limiting on the invention. An embodiment of the invention may be implemented with respect to any type of application, such as, for example, applications that are served, the instances of any type of server application, a platform application, a stand-alone application, an administration application, or a combination thereof.

An application, including an application implementing all or part of an embodiment, may further include data objects, code objects, encapsulated instructions, application fragments, services, and other types of resources available in a data processing environment. For example, a Java® object, an Enterprise Java Bean (EJB), a servlet, or an apples may be manifestations of an application with respect to which the invention may be implemented. (Java and all Java-based trademarks and logos are trademarks or registered trademarks of Oracle and/or its affiliates).

An illustrative embodiment may be implemented in hardware, software, or a combination thereof. An illustrative embodiment may further be implemented with respect to any type of computing resource, such as a physical or virtual data processing system or components thereof, that may be available in a given computing environment.

The examples in this disclosure are used only for the clarity of the description and are not limiting on the illustrative embodiments. Additional data, operations, actions, tasks, activities, and manipulations will be conceivable from this disclosure and the same are contemplated within the scope of the illustrative embodiments.

The illustrative embodiments are described using specific code, designs, architectures, layouts, schematics, and tools only as examples and are not limiting on the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures.

Any advantages listed herein are only examples and are not intended to be limiting on the illustrative embodiments. Additional or different advantages may be realized by specific illustrative embodiments. Furthermore, a particular illustrative embodiment may have some, all, or none of the advantages listed above.

Figure 2:
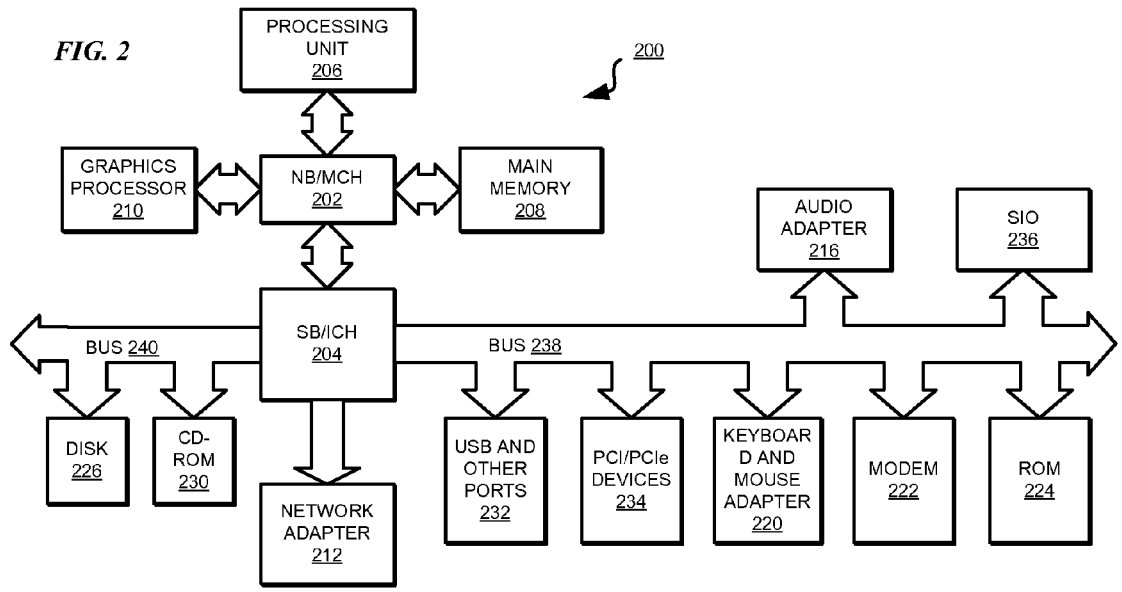
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a pictorial representation of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables. Server 104 and server 106 couple to network 102 along with storage unit 108. Software applications may execute on any computer in data processing environment 100.

In addition, clients 110, 112, and 114 couple to network 102. A data processing system, such as server 104 or 106, or client 110, 112, or 114 may contain data and may have software applications or software tools executing thereon.

A data processing system, such as server 104, may include memory management application 105 executing thereon. Application 105 may be an application for managing a memory component of server 104. Application 105 may be any suitable application in any combination of hardware and software for managing a memory, including but not limited to a memory manager component of an operating system kernel. Application 105 may be modified to implement an embodiment of the invention described herein. Alternatively, application 105 may operate in conjunction with another application (not shown) that implements an embodiment.

Servers 104 and 106, storage unit 108, and clients 110, 112, and 114 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client-server environment in which the illustrative embodiments may be implemented. A client-server environment enables software applications and data to be distributed across a network such that an application functions by using the interactivity between a client data processing system and a server data processing system. Data processing environment 100 may also employ a service oriented architecture where interoperable software components distributed across a network may be packaged together as coherent business applications.

With reference to FIG. 2, this figure depicts a block diagram of a data processing system in which illustrative embodiments may be implemented. Data processing system 200 is an example of a computer, such as server 104 or client 110 in FIG. 1, in which computer usable program code or instructions implementing the processes of the illustrative embodiments may be located for the illustrative embodiments.

In the depicted example, data processing system 200 employs a hub architecture including North Bridge and memory controller hub (NB/MCH) 202 and south bridge and input/output (I/O) controller hub (SB/ICH) 204. Processing unit 206, main memory 208, and graphics processor 210 are coupled to north bridge and memory controller hub (NB/MCH) 202. Processing unit 206 may contain one or more processors and may be implemented using one or more heterogeneous processor systems. Graphics processor 210 may be coupled to the NB/MCH through an accelerated graphics port (AGP) in certain implementations.

In the depicted example, local area network (LAN) adapter 212 is coupled to south bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to south bridge and I/O controller hub 204 through bus 238. Hard disk drive (HDD) 226 and CD-ROM 230 are coupled to south bridge and I/O controller hub 204 through bus 240. PCI/PCIe devices may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE) or serial advanced technology attachment (SATA) interface. A super I/O (SIO) device 236 may be coupled to south bridge and I/O controller hub (SB/ICH) 204.

An operating system runs on processing unit 206. The operating system coordinates and provides control of various components within data processing system 200 in FIG. 2. The operating system may be a commercially available operating system such as Microsoft® Windows® (Microsoft and Windows are trademarks of Microsoft Corporation in the United States, other countries, or both), or Linux® (Linux is a trademark of Linus Torvalds in the United States, other countries, or both). An object oriented programming system, such as the Java™ programming system, may run in conjunction with the operating system and provides calls to the operating system from Java™ programs or applications executing on data processing system 200 (Java and all Java-based trademarks and logos are trademarks or registered trademarks of Oracle and/or its affiliates).

Program instructions for the operating system, the object-oriented programming system, the processes of the illustrative embodiments, and applications or programs are located on storage devices, such as hard disk drive 226, and may be loaded into a memory, such as, for example, main memory 208, read only memory 224, or one or more peripheral devices, for execution by processing unit 206. Program instructions may also be stored permanently in non-volatile memory and either loaded from there or executed in place. For example, the synthesized program according to an embodiment can be stored in non-volatile memory and loaded from there into DRAM.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in north bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a PDA.

Figure 3:
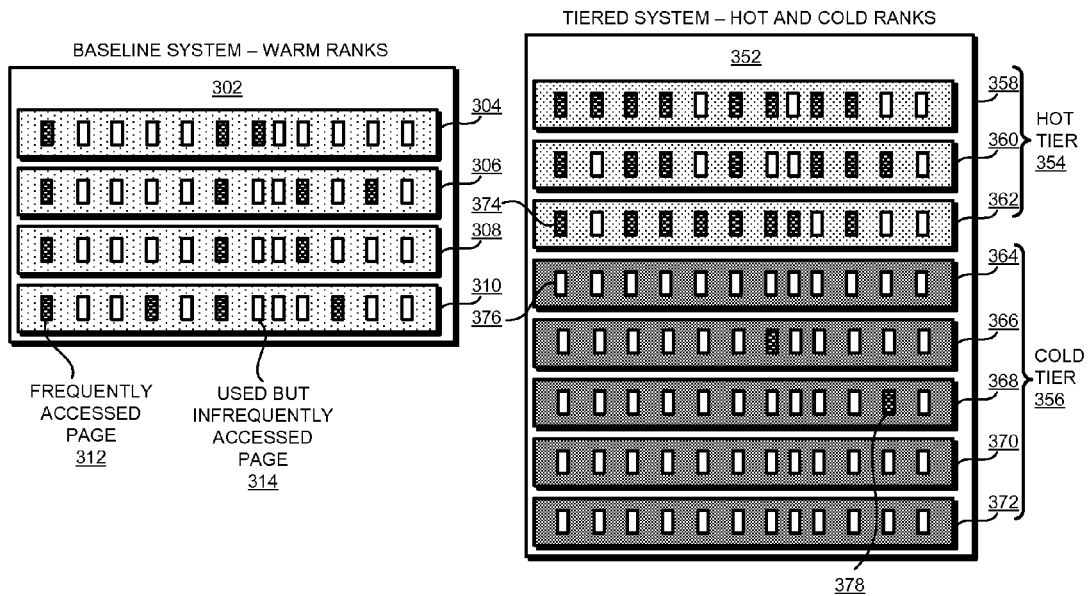
FIG. 3 depicts an example configuration for increasing memory capacity in a power-constrained system in accordance with an illustrative embodiment.

With reference to FIG. 3, this figure depicts an example configuration for increasing memory capacity in a power-constrained system in accordance with an illustrative embodiment. Memory 302 may be main memory 208 in FIG. 2, without implying a limitation thereto. For example, memory 302 may be a memory unit associated with PCI device 234 in FIG. 2, or a memory associated with a USB device coupled with USB port 232 in FIG. 2.

Memory 302 is configured for a prior art manner of operation using ranks 304, 306, 308, and 310. Each of ranks 304-310 is in use, i.e., in active mode. Such a configuration is considered a baseline configuration without the benefit of an embodiment.

Ranks 304-310 include some pages, such as page 312, which are accessed at more than a threshold rate of access per unit of time. Ranks 304-310 also include some pages, such as page 314, which are accessed at less than a threshold rate of access per unit of time.

As an example, assume that a power budget of memory 302 is twelve watts. Further assume that each rank consumes three watts in active mode and one-half watt in low-power mode. Having ranks 304-310 active, memory 302 is configured in a manner that the capacity of memory 302 is limited to four ranks as shown.

Even if additional ranks are available in memory 302, such ranks cannot be used when additional memory capacity is needed. When that capacity of memory 302 becomes insufficient for a workload, such as when additional virtual machines (VMs) are brought online and use memory 302, some pages from memory 302 will be paged-out to disk. The applications, such as one of the virtual machines using memory 302, whose page is paged-out will suffer a performance degradation, which in majority of cases is unacceptable according to a desired performance level.

Memory 352 is the same memory, such as main memory 208, a memory unit associated with PCI device 234, or a memory associated with a USB device coupled with USB port 232 in FIG. 2, but is configured differently than memory 302's configuration. Memory 352 is configured to use hot tier 354 and cold tier 356 in accordance with an embodiment.

Hot tier 354 includes ranks 356, 358, and 360, which are configured to operate in active mode. Cold tier 356 includes ranks 362, 364, 366, 368, 370, and 372, which are configured to operate in a low-power mode.

A rank in hot tier 354, such as rank 358, is initially configured to store those pages whose access rate matches or exceeds a threshold during a given workload (frequently accessed pages). In one embodiment, all such pages will be accommodated in hot tier 354. In another embodiment, a majority of such pages will be accommodated in hot tier 354, and a minority of such pages will be accommodated in cold tier 356.

A rank in cold tier 356, such as rank 364, is initially configured to store those pages whose access rate is below the threshold during the given workload (used but infrequently accessed pages). In one embodiment, all such pages having access rates below the threshold will be accommodated in cold tier 356. In another embodiment, a majority of such pages will be accommodated in cold tier 356, and a minority of such pages will be accommodated in hot tier 354.

Configuring hot tier 354 and cold tier 356 in this manner, an embodiment seeks to concentrate frequently accessed pages into a fewer number of active ranks as compared to a baseline configuration. Continuing with the above example of a power budget of twelve watts, as depicted, hot tier 354 includes three active ranks consuming a total of nine watts, and cold tier 356 includes five ranks consuming a total of two and half watts—a total of eleven and a half watts.

In this example, memory 352 is configured with eight ranks as compared to four ranks of memory 302's configuration. Thus, the memory capacity of memory 352 is increased over memory capacity of memory 302. Furthermore, the power consumption of memory 352 is less than the power consumption of memory 302.

A memory configuration is an "iso-power" of another memory configuration if the first memory configuration' total power consumption is substantially equivalent to the power consumption of the second memory configuration. Thus, memory 302 and 352 are iso-powers of one another, yet the memory capacity of memory 352 is increased over the capacity of memory 352. An embodiment can thus mitigate performance overhead of power management by localizing the frequently accessed pages to a smaller set of active ranks and exchanging an active rank for one or more ranks in low-power mode.

Figure 4:
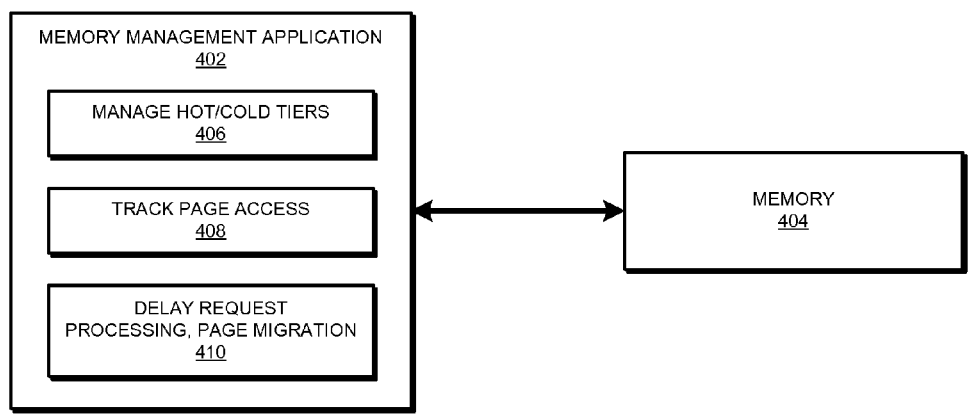
FIG. 4 depicts a block diagram of an application for managing a memory in accordance with an illustrative embodiment.

With reference to FIG. 4, this figure depicts a block diagram of an application for managing a memory in accordance with an illustrative embodiment. Application 402 can be an improvement of application 105 in FIG. 1. Application 402 can also be an application that is used by application 105 in FIG. 1 to provide the features of an embodiment. Application 402 interacts with memory 404, which can be configured in the manner of memory 352 in FIG. 3.

Application 402 includes component 406 to manage hot and cold tiers in memory 404. For example, component 406 can create a hot tier and assign certain ranks of memory 404 to the hot tier. Component 406 can create a cold tier and assign certain ranks of memory 404 to the cold tier.

Furthermore, component 406 can determine how many ranks to assign to a hot or cold tier by analyzing a given workload. Component 406 can also dynamically reconfigure a hot or cold tier—such as to include more or fewer ranks that a previous configuration of the hot or cold tier—based on the workload analysis.

For example, in one embodiment, memory 404 is a physical memory in a host computer including twenty four ranks. Several VMs are to be configured on the host computer, to execute and perform certain operations as a first workload. Component 406 determines that up to one hundred VMs can be supported using eight ranks in a baseline configuration (with several other VMs powered off to enable maintaining the active memory within the power budget).

Sometime during the execution of the first workload, the first workload is modified into a second workload, which requires one hundred and fifty VMs to be configured on the host. Component 406 analyzes the change in the workload to determine that a hot tier of four ranks and a cold tier of twelve ranks will maintain the power constraint and support up to two hundred VMs within a desired performance metric. Component 406 reconfigures memory 404 to assign four ranks to a hot tier and twelve ranks to a cold tier, and distribute the pages to the hot and cold tiers in the manner described with respect to FIG. 3.

Sometime during the execution of the second workload, the second workload is modified into a third workload, which requires two hundred and fifty VMs to be configured on the host. Component 406 analyzes the change in the workload to determine that a hot tier of two ranks and a cold tier of twenty two ranks will maintain the power constraint and support up to three hundred VMs within a desired performance metric. Component 406 reconfigures memory 404 to assign two ranks to the hot tier and twenty two ranks to the cold tier, and re-distribute the pages to the hot and cold tiers in the manner described with respect to FIG. 3.

Component 408 tracks accesses to a page. For example, a page in a cold tier in memory 404 may begin to be a target of memory access requests. Component 408 counts the number of accesses being made to the page within a specified period. For example, in one embodiment, component 408 counts the number of accesses to a page over a period to help component 410's function.

As one function of component 410, component 410 determines whether to perform request throttling, that is, whether a request to access a memory page should be delayed. Power consumption is energy consumed divided by time over which the energy is consumed. If the time over which the energy is consumed is prolonged, such as by introducing a delay, the power consumption can be reduced. When memory 404 is targeted by a larger than a threshold number of requests in a given period, delaying some of the requests can reduce the power consumption.

Furthermore, delaying a memory access request can serve several purposes. For example, if a request is directed to a page in a rank in the cold tier, delaying that request allows the rank in the cold tier to remain in a low-power mode longer before the rank is "woken up" into active mode to service the request. Thus, delaying a request in such circumstances allows an embodiment to take advantage of the low-power mode for a longer duration without a significant performance degradation.

As another example, if a request is directed to a page in a rank in the hot tier, delaying that request allows the hot tier to process one less request in a given period, thereby reducing the power consumption of the hot tier in that period. Thus, delaying a request in such circumstances allows an embodiment to contain the power consumption of the memory within the power budget during busy periods without a significant performance degradation.

As another function of component 410, component 410 determines whether a page should be migrated from the cold tier to the hot tier, or vice versa. For example, if a page in a rank in the cold tier starts to receive a number of access requests that exceeds a threshold during a period, component 410 can make a determination that the page should be migrated to the hot tier. Conversely, a page in the hot tier may receive less than a threshold number of requests, and may be moved to the cold tier, perhaps to make space for moving a page from the cold tier to the hot tier as described above.

Furthermore, component 410 can perform the migration on-the-fly, such as when a request for the page is pending and processing that request will push the number of accesses to that page to the threshold number. Alternatively, component 410 can also perform the migration by periodically analyzing the access counts of various pages. An embodiment may implement both methods of page migration.

In one embodiment, component 410 determines whether the page should be migrated from the cold tier to the hot tier, or vice versa, using the count from component 408. In another embodiment, using the count from component 408, component 410 determines whether the access request for the page should be processed with a delay, and if so, a period of the delay. In an embodiment, component 410 can make both decisions—the migrating decision and the delay decision—using the count from component 408.

Figure 5:
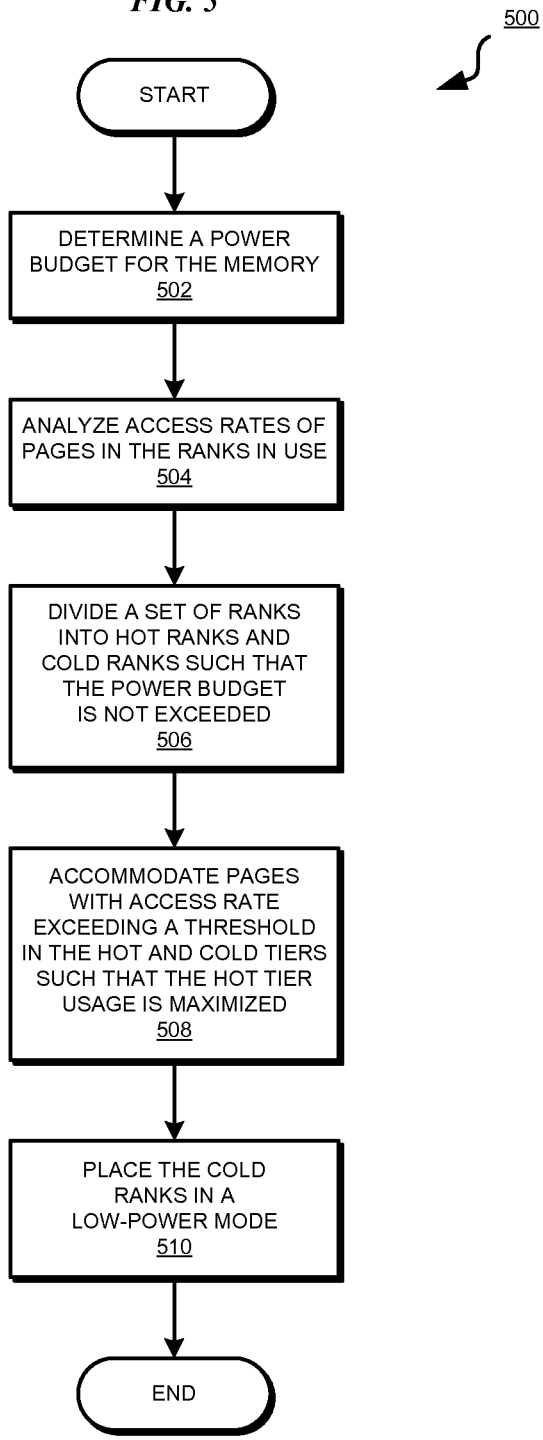
FIG. 5 depicts a flowchart of an example process for increasing the capacity of a power-constrained memory in accordance with an illustrative embodiment.

With reference to FIG. 5, this figure depicts a flowchart of an example process for increasing the capacity of a power-constrained memory in accordance with an illustrative embodiment. Process 500 can be implemented in a memory management application, such as application 402 in FIG. 4.

Process 500 begins by determining a power budget for a memory (step 502). For example, in one embodiment, process 500 makes the determination of step 502 by observing that the power supply cannot supply more than a certain amount of power to the memory, as establishing that amount or a lower amount as the power budget. In another example embodiment, process 500 makes the determination of step 502 by receiving a power budget specification from an application, such as the operating system. In another example embodiment, process 500 makes the determination of step 502 by receiving a power budget specification from a user, such as a system administrator.

Process 500 analyzes the access rates of one or more pages in the ranks in use (step 504). For example, process 500 may perform step 504 in component 406 in FIG. 4.

Process 500 divides a set of ranks into hot ranks (ranks in a hot tier) and cold ranks (ranks in a cold tier) such that the total power consumption of the hot and cold ranks does not exceed the power budget (step 506). The set of ranks so divided can be all or a subset of the ranks available in a given data processing system. Furthermore, the set of ranks being divided in step 506 can include a number of ranks different from a number of ranks in step 504.

Process 500 places pages with access rate exceeding a threshold in the hot and cold tiers such that the usage of ranks in the hot tier is maximized for such pages (step 508). Process 500 places the ranks in the cold tier in a low-power mode (step 510). Process 500 ends thereafter.

Figure 6:
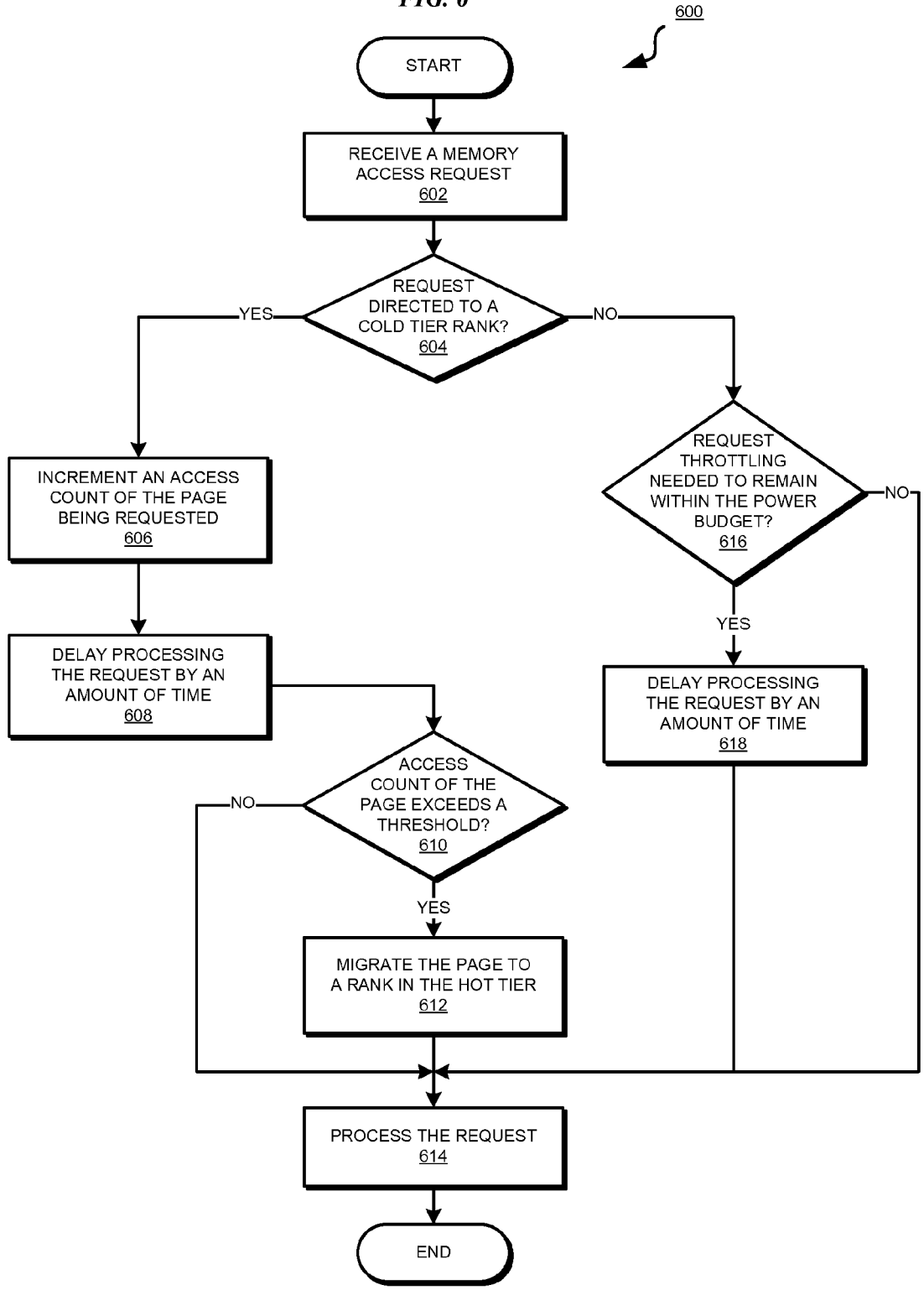
FIG. 6 depicts a flowchart of an example process for request throttling and page migration in accordance with an illustrative embodiment.

With reference to FIG. 6, this figure depicts a flowchart of an example process for request throttling and page migration in accordance with an illustrative embodiment. Process 600 can be implemented in application 402 in FIG. 4.

Process 600 begins by receiving a memory access request for accessing a page in memory (step 602). Process 600 determines whether the access request is directed to a rank in the cold tier of the memory (step 604).

If the request is not directed to a rank in the cold tier ("Yes" path of step 604), process 600 increments an access count of the page being requested (step 606). Process 600 delays the processing of the request by an amount of time (step 608).

The amount of the delay can be computed in any manner suitable for an implementation. For example, an implementation may set a time limit for keeping a rank a low-power setting before the rank can be switched to an active mode. The delay may be the difference between the time limit and an elapsed time from the beginning of the time limit window.

Process 600 determines whether the access count of the requested page exceeds a threshold number of accesses (step 610). If the count exceeds the threshold ("Yes" path of step 610), process 600 migrates the page to a rank in the hot tier (step 612). Process 600 processes the request (step 614). Process 600 ends thereafter. Although not depicted in FIG. 6 for clarity of the depiction, a page can be migrated from a hot tier to a cold tier in a similar manner within the scope of process 600. For example, a modified process 600 may determine whether the access count of a requested page from a rank in the hot tier is below a threshold number of accesses. When the count is below the threshold, the modified process 600 can migrate the page to a rank in the cold tier.

This description of request throttling and on-the-fly page migration according to process 600 is only an example implementation of an embodiment, and is not intended to be limiting on the illustrative embodiments. For example, an implementation may execute page throttling for a request, and not page migration, or vice versa within the scope of the illustrative embodiments. As another example, an implementation may execute page throttling for a request with periodic page migration, on-the-fly page migration, or a combination thereof, within the scope of the illustrative embodiments.

Returning to step 604, if the request is directed to a rank in the hot tier ("No" path of step 604), process 600 determines whether request throttling is needed to remain within the power budget (step 616). If request throttling is needed ("Yes" path of step 616), process 600 delays the processing of the request by an amount of time (step 618). The delay can be computed in the manner similar to the delay of step 608. Process 600 then proceeds to step 614, and ends thereafter. If request throttling is not needed ("No" path of step 616), process proceeds to step 614, and ends thereafter.

Figure 7:
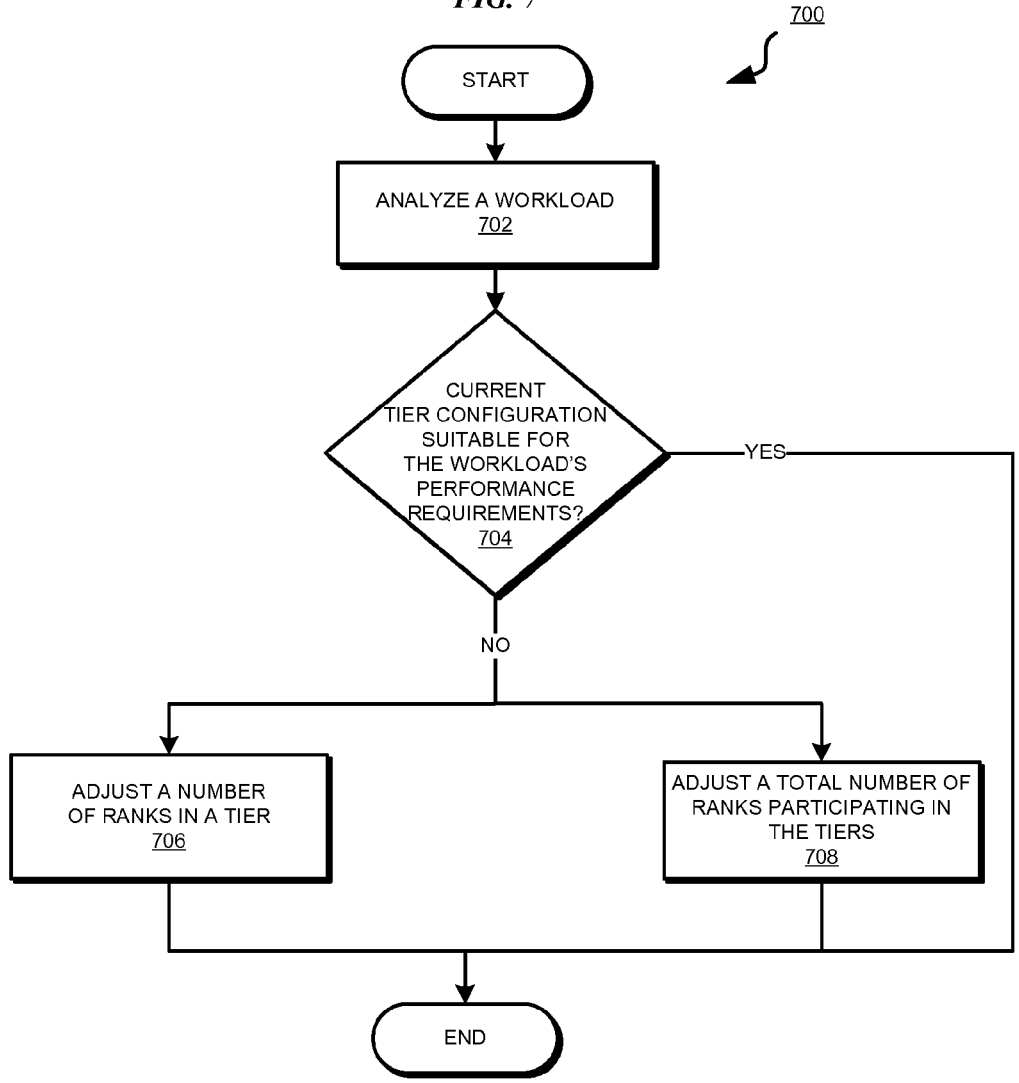
FIG. 7 depicts a flowchart of an example process for dynamically reconfiguring a memory for increased memory capacity in power constrained systems in accordance with an illustrative embodiment.

With reference to FIG. 7, this figure depicts a flowchart of an example process for dynamically reconfiguring a memory for increased memory capacity in power constrained systems in accordance with an illustrative embodiment. Process 700 can be implemented in application 402 in FIG. 4.

Process 700 begins by analyzing a workload (step 702). Process 700 determines whether the current configuration of the memory, including the configuration of the hot and cold tiers and the number of ranks therein, is suitable for the workload's performance requirements (step 704). For example, given a current configuration of the hot and cold tiers and the number of ranks therein, process 700 may determine at step 704 that the current configuration would cause paging-out of some pages to disk, causing the performance of the workload to drop below an acceptable performance level. Thus, in this example, process 700 may determine that the current configuration is not suitable for the workload's performance requirements.

If process 700 determines that the current configuration is suitable for meeting or exceeding the workload's performance requirements ("Yes" path of step 704), process 700 ends thereafter without changing the configuration of the hot and cold tiers and the ranks therein. If process 700 determines that the current configuration is not suitable for meeting or exceeding the workload's performance requirements ("No" path of step 704), process 700 can perform step 706, step 708, or both.

For example, process 700 may adjust a number of ranks in a tier, by moving a rank from the cold tier to the hot tier, or vice versa, while keeping the number of total ranks participating in the tiers unchanged (step 706). Process 700 may end thereafter.

As another example, process 700 may adjust the total number of ranks participating in the tiers, such as by changing a number of hot tier ranks, cold tier ranks, or both, (step 708). Process 700 may end thereafter.

Figure 8:
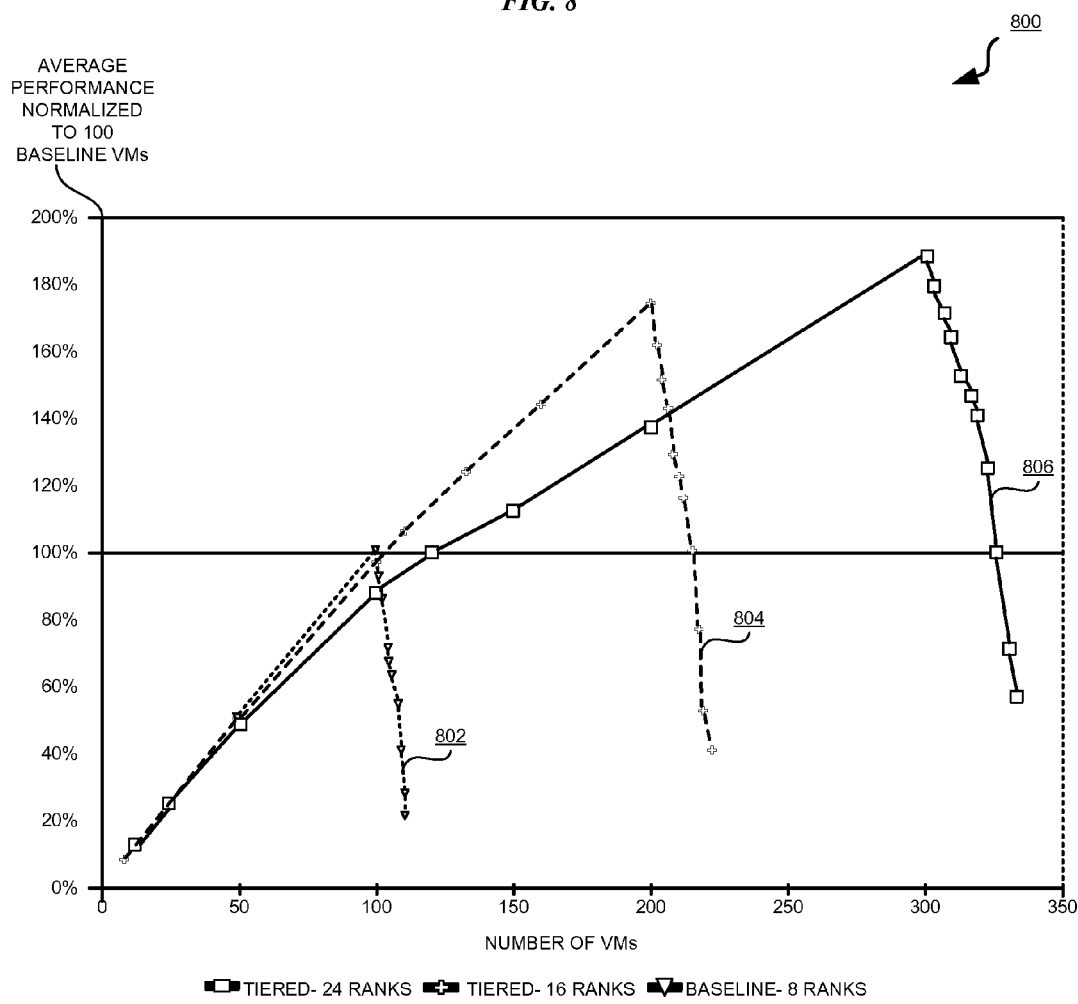
FIG. 8 depicts a graph of an advantage achieved by increasing the memory capacity in a power constrained system in accordance with an illustrative embodiment.

With reference to FIG. 8, this figure depicts a graph of an advantage achieved by increasing the memory capacity in a power constrained system in accordance with an illustrative embodiment. Graph 800 is produced using implementations of processes 500, 600, and 700 in FIGS. 5, 6, and 7, respectively, in a host where a number of VMs are configured as workloads.

Graph 800 depicts a number of VMs configured in a workload along the X-axis. Graph 800 depicts along the Y-axis, an aggregate performance normalized to 100 VMs executing with a baseline configuration of the memory in the host.

Graphs 802, 804, and 806 are plotted using different memory configurations, a common power budget being applicable to each configuration. Graph 802 depicts the performance of the workload as the number of VMs is increased up to and beyond 100 VMs, while using a baseline configuration of eight ranks in the memory. As is evident, the performance peaks at 100 percent for 100 VMs, and then sharply declines. The decline in the performance is because as the number of VMs is increased past 100, some pages belonging to some of the VMs begin to be paged-out to disk and paged-in from the disk, incurring severe performance degradation.

Graph 804 depicts the performance of the workload as the number of VMs is increased up to and beyond 200 VMs, while using a configuration of sixteen ranks is configured in the memory. Four ranks are configured in a hot tier and the remaining twelve ranks are configured in a cold tier, while remaining within the power budget. As is evident, the aggregate performance now peaks at 175 percent of baseline for 200 VMs, and then sharply declines. The decline in the performance is because as the number of VMs is increased past 200, some pages belonging to some of the VMs begging to be paged-out to disk and paged-in from the disk, incurring severe performance degradation. Also note that at approximately 100 VMs the performance of the workload using this memory configuration is slightly reduced from the baseline configuration because some pages are being accessed in cold ranks, which are slower than hot ranks because of the entry/exit latency from the low-power mode.

Graph 806 depicts the performance of the workload as the number of VMs is increased up to and beyond 300 VMs, while using a configuration of twenty four ranks is configured in the memory. Two ranks are configured in a hot tier and the remaining twenty two ranks are configured in a cold tier, while remaining within the power budget. As is evident, the aggregate performance now peaks at 190 percent of baseline for 300 VMs, and then sharply declines. The decline in the performance is because as the number of VMs is increased past 300, some pages belonging to some of the VMs begging to be paged-out to disk and paged-in from the disk, incurring severe performance degradation. Also note that at approximately 100 VMs the performance of the workload using this memory configuration is further reduced from the configuration of graph 804 because more pages are being accessed in cold ranks, as compared to the configuration of graph 804.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Thus, a system, and computer program product are provided in the illustrative embodiments for increasing memory capacity in a power-constrained system. Using an embodiment of the invention, the utilization of the power allocated to a memory can be improved without exceeding the power budget for the memory. Furthermore, using an embodiment, the total memory capacity available for processing workloads can be increased without exceeding the power budget for the memory.

An embodiment aggressively uses memory idle low power modes to lower the power cost of idle memory in the cold tier, thereby lowering the power cost of ranks in cold tier and increasing the total number of usable ranks in the memory system. Furthermore, an embodiment uses activity monitoring of pages to intelligently place and move pages between the hot and cold tiers, re-size the hot and cold tiers, or both, to attain a desired performance level while controlling the rate of memory access requests with delays. Thus, an embodiment can deliver higher memory capacity and performance within given power constraints as compared to the prior art of memory management.

The embodiments are described using one hot tier and one cold tier, and one active mode and one low-power mode, only as an example for the clarity of the description. Such numbers of tiers and modes are not intended to be limiting on the illustrative embodiments. For example, in an implementation where multiple low-power modes of varying power consumptions are available, an embodiment may be implemented using multiple tiers including ranks at different power mode settings within the scope of the illustrative embodiments.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable storage device(s) or computer readable media having computer readable program code embodied thereon.

Any combination of one or more computer readable storage device(s) or computer readable media may be utilized. The computer readable medium may be a computer readable signal medium or a computer readable storage medium. A computer readable storage device may be an electronic, magnetic, optical, electromagnetic, or semiconductor system, apparatus, or device, or any suitable combination of the foregoing. More specific examples (a non-exhaustive list) of the computer readable storage device would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage device may be any tangible device that can store a program for use by or in connection with an instruction execution system, apparatus, or device. The terms "computer usable storage device" and "storage device" do not encompass a signal propagation medium such as a copper cable, optical fiber, or wireless transmission medium, any description in this disclosure to the contrary notwithstanding.

Program code embodied on a computer readable storage device or computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to one or more processors of one or more general purpose computers, special purpose computers, or other programmable data processing apparatuses to produce a machine, such that the instructions, which execute via the one or more processors of the computers or other programmable data processing apparatuses, create means for implementing the functions/acts specified in the flowchart and/or block diagram block or blocks.

These computer program instructions may also be stored in one or more computer readable storage devices or computer readable that can direct one or more computers, one or more other programmable data processing apparatuses, or one or more other devices to function in a particular manner, such that the instructions stored in the one or more computer readable storage devices or computer readable medium produce an article of manufacture including instructions which implement the function/act specified in the flowchart and/or block diagram block or blocks.

The computer program instructions may also be loaded onto one or more computers, one or more other programmable data processing apparatuses, or one or more other devices to cause a series of operational steps to be performed on the one or more computers, one or more other programmable data processing apparatuses, or one or more other devices to produce a computer implemented process such that the instructions which execute on the one or more computers, one or more other programmable data processing apparatuses, or one or more other devices provide processes for implementing the functions/acts specified in the flowchart and/or block diagram block or blocks.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A computer usable program product comprising a computer usable storage device including computer usable code for increasing a capacity of a memory, the computer usable code comprising:
    computer usable code for configuring, using an application executing using a processor wherein the memory includes a set of ranks, the memory to form a cold tier and a hot tier, the cold tier including a first subset of ranks from the set of ranks in the memory, and the hot tier including a second subset of ranks from the set of ranks in the memory;
computer usable code for determining whether a page to which a memory access request is directed is located in the cold tier in the memory; and
    computer usable code for throttling, responsive to the page being located in the cold tier of the memory, the processing of the memory access request by processing the memory access request with a delay.

2. The computer usable program product of claim 1, further comprising:
    computer usable code for determining, responsive to the page being located in the hot tier of the memory, whether to introduce the delay in processing the memory access request for the page located in the hot tier of the memory; and
    computer usable code for delaying, responsive to determining that the processing of the memory access request for the page located in the hot tier of the memory is to be delayed, the processing of the memory access request.

3. The computer usable program product of claim 1, wherein the determining whether to introduce the delay in processing the memory access request for the page located in the hot tier of the memory, further comprises:
    computer usable code for determining whether processing the memory access request without introducing the delay will cause a power budget for the memory to be exceeded; and
    computer usable code for processing without introducing the delay, the memory access request, responsive to determining that processing the memory access request without introducing the delay will not cause a power budget for the memory to be exceeded.

4. The computer usable program product of claim 1, further comprising:
    computer usable code for incrementing a first access count for the page to a second access count.

5. The computer usable program product of claim 1, wherein the computer usable code is stored in a computer readable storage medium in a data processing system, and wherein the computer usable code is transferred over a network from a remote data processing system.

6. The computer usable program product of claim 1, wherein the computer usable code is stored in a computer readable storage medium in a server data processing system, and wherein the computer usable code is downloaded over a network to a remote data processing system for use in a computer readable storage medium associated with the remote data processing system.

7. A data processing system for increasing a capacity of a memory, the data processing system comprising:
    a storage device including a storage medium, wherein the storage device stores computer usable program code; and
    a processor, wherein the processor executes the computer usable program code, and wherein the computer usable program code comprises:
    computer usable code for configuring, using an application executing using a processor wherein the memory includes a set of ranks, the memory to form a cold tier and a hot tier, the cold tier including a first subset of ranks from the set of ranks in the memory, and the hot tier including a second subset of ranks from the set of ranks in the memory;
computer usable code for determining whether a page to which a memory access request is directed is located in the cold tier in the memory; and
    computer usable code for throttling, responsive to the page being located in the cold tier of the memory, the processing of the memory access request by processing the memory access request with a delay.

* * * * *